United States Patent
Jayaraju et al.

(10) Patent No.: US 10,512,174 B2
(45) Date of Patent: Dec. 17, 2019

(54) METHOD OF FILLING THROUGH-HOLES TO REDUCE VOIDS AND OTHER DEFECTS

(71) Applicant: Rohm and Haas Electronic Materials LLC, Marlborough, MA (US)

(72) Inventors: Nagarajan Jayaraju, Framingham, MA (US); Leon Barstad, Raynham, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 0 days.

(21) Appl. No.: 15/384,678

(22) Filed: Dec. 20, 2016

(65) Prior Publication Data

US 2017/0238427 A1    Aug. 17, 2017

Related U.S. Application Data

(60) Provisional application No. 62/295,291, filed on Feb. 15, 2016.

(51) Int. Cl.

| | |
|---|---|
| *C25D 5/02* | (2006.01) |
| *H05K 3/42* | (2006.01) |
| *C23C 18/16* | (2006.01) |
| *C23C 18/38* | (2006.01) |
| *C25D 3/38* | (2006.01) |
| *C25D 5/56* | (2006.01) |
| *C25D 7/12* | (2006.01) |
| *H05K 1/09* | (2006.01) |

(Continued)

(52) U.S. Cl.
CPC ......... *H05K 3/429* (2013.01); *C23C 18/1653* (2013.01); *C23C 18/38* (2013.01); *C25D 3/38* (2013.01); *C25D 5/02* (2013.01); *C25D 5/56* (2013.01); *C25D 7/123* (2013.01); *H05K 1/09* (2013.01); *H05K 1/115* (2013.01); *H05K 3/0094* (2013.01); *H05K 3/423* (2013.01); *H05K 2201/032* (2013.01); *H05K 2203/0723* (2013.01)

(58) Field of Classification Search
None
See application file for complete search history.

(56) References Cited

U.S. PATENT DOCUMENTS

| | | | |
|---|---|---|---|
| 3,751,289 A | 8/1973 | Arcilesi | |
| 6,261,433 B1 * | 7/2001 | Landau | C25D 3/38 204/230.2 |
| 6,562,222 B1 | 5/2003 | Sekiguchi | |

(Continued)

FOREIGN PATENT DOCUMENTS

| | | |
|---|---|---|
| EP | 1026286 A2 | 8/2000 |
| EP | 1371757 A1 | 12/2003 |

(Continued)

OTHER PUBLICATIONS

Search report for corresponding Europe Application No. 17 15 4692 dated May 22, 2017.

(Continued)

*Primary Examiner* — Stefanie S Wittenberg
(74) *Attorney, Agent, or Firm* — John J. Piskorski

(57) ABSTRACT

Direct current plating methods inhibit void formation, reduce dimples and eliminate nodules. The method involves electroplating copper at a high current density followed by electroplating at a lower current density to fill through-holes.

8 Claims, 7 Drawing Sheets

(51) Int. Cl.
*H05K 1/11* (2006.01)
*H05K 3/00* (2006.01)

(56) References Cited

U.S. PATENT DOCUMENTS

| | | |
|---|---|---|
| 6,755,957 B2 | 6/2004 | Nakamura et al. |
| 6,773,573 B2 | 8/2004 | Gabe et al. |
| 6,911,068 B2 | 6/2005 | Cobley et al. |
| 7,501,014 B2 | 3/2009 | Poole et al. |
| 7,611,569 B2 | 11/2009 | Poole et al. |
| 7,857,960 B2 | 12/2010 | Hayashi et al. |
| 7,879,218 B1 | 2/2011 | Webb |
| 8,048,284 B2 | 11/2011 | Reddington et al. |
| 8,268,157 B2 | 9/2012 | Niazimbetova |
| 8,268,158 B2 | 9/2012 | Niazimbetova |
| 9,506,158 B2 | 11/2016 | Rohde |
| 2001/0013472 A1 | 8/2001 | Nakamura et al. |
| 2001/0042694 A1* | 11/2001 | Robertson .......... G01N 27/4161 205/794 |
| 2004/0226827 A1 | 11/2004 | Matsuda |
| 2007/0170065 A1 | 7/2007 | Mashino |
| 2010/0300888 A1* | 12/2010 | Ponnuswamy .......... C25D 3/38 205/157 |
| 2010/0320809 A1 | 12/2010 | Mayer |
| 2011/0180412 A1 | 7/2011 | Shimoyama |
| 2011/0290860 A1 | 12/2011 | Niazimbetova |
| 2012/0175264 A1 | 7/2012 | Lai |
| 2013/0333930 A1* | 12/2013 | Koyanagi ............... H05K 1/184 174/258 |
| 2014/0367279 A1 | 12/2014 | Brogan |
| 2015/0156888 A1* | 6/2015 | Kawai ..................... C25D 7/00 205/125 |

FOREIGN PATENT DOCUMENTS

| | | |
|---|---|---|
| EP | 1152071 B1 | 5/2005 |
| EP | 2025778 A2 | 2/2009 |
| EP | 2465976 A1 | 6/2012 |
| JP | 978251 A | 3/1997 |
| JP | 2001271196 A | 10/2001 |
| JP | 2002245484 A | 9/2002 |
| JP | 2002363790 A | 12/2002 |
| JP | 200341393 A | 2/2003 |
| JP | 2004360055 A | 12/2004 |
| JP | 2005-093934 A | 4/2005 |
| JP | 4157985 B2 | 10/2008 |
| JP | 2009-021581 A | 1/2009 |
| JP | 4762423 B2 | 8/2011 |
| WO | 2001013472 | 2/2001 |
| WO | 2008157612 A1 | 12/2008 |
| WO | 2012175249 A1 | 12/2012 |

OTHER PUBLICATIONS

Rasmussen, et al, "Microvia Filling: A challenge for process quality", OnBoard Technology, Apr. 2006, pp. 8-10.
Search report for corresponding Taiwan Application No. 106101710 dated May 21, 2018.
Search report for corresponding China Application No. 201710066334.2 dated Sep. 13, 2018.

* cited by examiner

METHOD OF FILLING THROUGH-HOLES TO REDUCE VOIDS AND OTHER DEFECTS

FIELD OF THE INVENTION

The present invention is directed to a method of filling through-holes to reduce voids and other defects. More specifically, the present invention is directed to a method of filling through-holes to reduce voids and other defects by filling the through-holes using a direct current cycle of high current density for a predetermined period of time followed by applying a low current density for a predetermined period of time.

BACKGROUND OF THE INVENTION

High density interconnects is an important design in the fabrication of printed circuit boards with through-holes. Miniaturization of these devices relies on a combination of thinner core materials, reduced line widths and smaller diameter through-holes. The diameters of the through-holes range from 75 μm to 125 μm. Filling the through-holes by copper plating has become more and more difficult with higher aspect ratios. This results in larger voids and deeper dimples. Another problem with through-hole filling is the way they tend to fill. Unlike vias which are closed at one end through-holes pass through a substrate and are open at two ends. Vias fill from bottom to top. In contrast, when through-holes are being filled with copper, the copper tends to begin to deposit on the walls at the center of the through-hole where it plugs at the center forming "butterfly wings" or two vias. The two vias fill to complete the deposition of the holes. Accordingly, the copper plating baths used to fill vias are not typically the same as are used to fill through-holes. Plating bath levelers and other bath additives are chosen to enable the right type of fill. If the right combination of additives is not chosen then the copper plating results in undesired conformal copper deposition. FIG. 1 is a diagram of current density (ASD) versus time in minutes of conventional direct current application to a substrate for filling through-holes. Cathodic current is applied to the substrate. Current density is applied for a given period of time such as for 100 minutes without changing the current density until the through-holes are filled.

Often the copper fails to completely fill the through-hole and both ends remain unfilled. An incomplete through-hole fill with copper deposit in the center with unfilled ends is sometimes referred to as "dog-boning". The open spaces at the top and bottom of the holes are referred to as dimples. Entire dimple elimination during through-hole filling is rare and unpredictable. Dimple depth is perhaps the most commonly used metric for quantifying through-hole fill performance. Dimple requirements depend on through-hole diameter and thickness and it varies from one manufacturer to another. In addition to dimples, gaps or holes referred to as voids may form within a copper through-hole fill. Larger dimples affect further processing of the panel and larger voids affect device performance. An ideal process completely fills through-holes with a high degree of planarity, i.e., build up consistency, without voids to provide optimum reliability and electrical properties and at as low as possible a surface thickness for optimum line width and impedance control in an electrical device.

In order to address the foregoing problems the industry typically uses two different electroplating baths when attempting to plug and fill through-holes. A first copper bath is used to fill the through-holes until the two vias are formed in the through-holes as mentioned above. A second bath having a substantially different formulation specifically directed to filling vias replaces the first bath to complete the filling process. However, this process is both time consuming and inefficient. The through-hole filling process must be closely monitored to gauge the time when the first bath must be replaced with a via filling bath. Failure to change baths at the correct time typically results in dimple and void formation. Moreover, using two distinct plating baths for a single process increases the cost to both the manufacture and the customer. The plating process must be stopped to change the baths, thus further reducing the efficiency of the process.

In addition, the thickness of substrates such as printed circuit boards is increasing. Many conventional printed circuit boards now have a thickness exceeding 100 μm. While conventional direct current plating has been successful in providing acceptable through-hole fill under some circumstances for printed circuit boards having a thickness of 100 μm or less, attempts to fill through-holes in boards with thickness ranges exceeding 100 μm such as 200 μm and greater has been less than satisfactory. Often, the through-holes have unacceptable amounts of dimples exceeding 10 μm in depth and average void areas in the through-holes in excess of 10% to 15%.

Another problem encountered in metal plating is the formation of nodules on the metal deposit. Nodules are believed to be crystals of the metal being plated and grow out of the plated surface. Nodules may range in diameter from less than 1 micron to as large as several millimeters. Nodules are undesirable for a variety of electrical, mechanical, and cosmetic reasons. For example, nodules are readily detached and carried by cooling air flows into electronic assemblies, both within and external to electronic article housings, where they may cause short-circuit failure. Therefore, the nodules have to be removed before the plated substrates are assembled into electronic articles. Conventional methods of removing the nodules involve laser inspection of each metal plated substrate followed by manual removal of the nodules by workers using microscopes. Such conventional methods leave room for worker error and are inefficient.

Accordingly, there is a need for a method to improve through-hole filling of substrates such as printed circuit boards.

SUMMARY OF THE INVENTION

Methods include providing a substrate with a plurality of through-holes including a layer of electroless copper, copper flash or combinations thereof on a surface of the substrate and walls of the plurality of through-holes; immersing the substrate in a copper electroplating bath; and filling the through-holes with copper by a direct current cycle comprising applying a current density for a first predetermined period of time followed by applying a lower direct current density for a second predetermined period of time.

The methods reduce or inhibit dimple formation and voids during through-hole filling. Dimples are typically less than 10 μm deep. The reduced depth of the dimples and void area improves throwing power, thus providing a substantially uniform copper layer on the surface of the substrate and good through-hole filling. In addition, the methods may be used to fill though-holes of substrates having thickness ranges of 200 μm or greater. The methods also inhibit nodule formation.

DETAILED DESCRIPTION OF THE INVENTION

Figure 1:
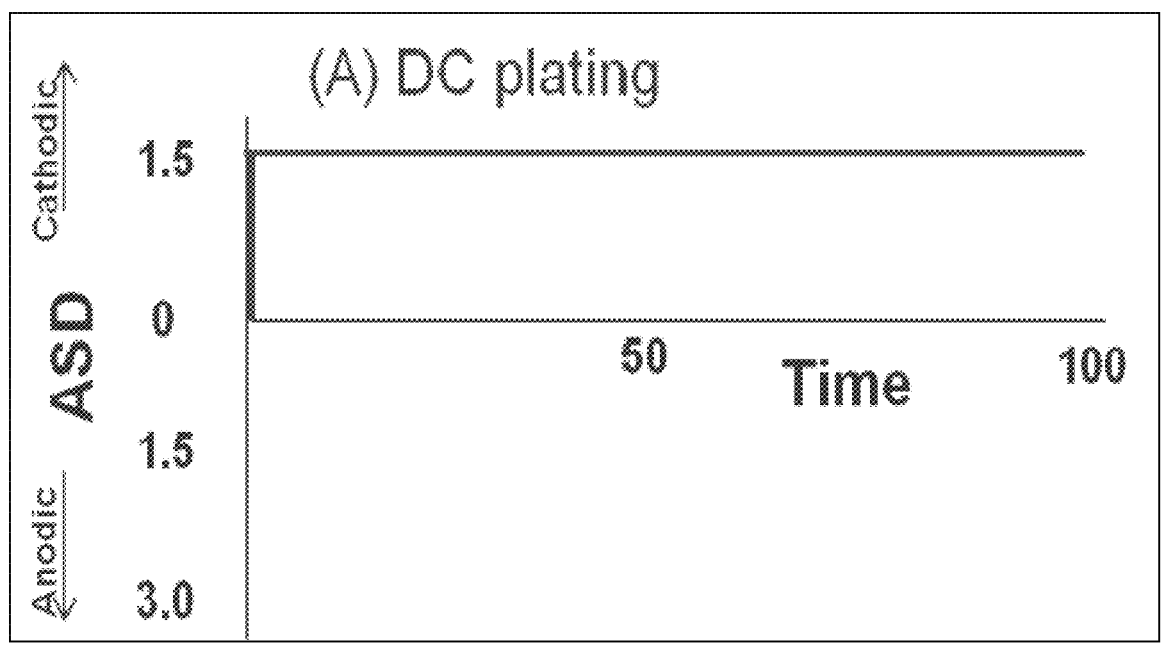
FIG. 1 is a diagram of ASD versus time in minutes of conventional DC current application for filling through-holes in a substrate.

As used throughout this specification, the abbreviations given below have the following meanings, unless the context clearly indicates otherwise: g=gram; mL=milliliter; L=liter; cm=centimeter; gm=micron; ppm=parts per million=mg/L; ° C.=degrees Centigrade; g/L=grams per liter; DC=direct current; ASD=amperes/dm$^2$; DI=deionized; wt %=percent by weight; $T_g$=glass transition temperature; Void=a space free of copper within a through-hole otherwise filled with copper metal; dimple depth=distance from the deepest point of the dimple to the level of copper plated on the surface of a substrate; void area of a single through-hole=0.5 A×0.5 B×π where A is height of the void and B is the diameter of the void at its widest point in a through-hole; through-hole area=height of the through-hole×the diameter of the through-hole; and % void area=void area/through-hole area×100%.

The terms "printed circuit board" and "printed wiring board" are used interchangeably throughout this specification. The terms "plating" and "electroplating" are used interchangeably throughout this specification. The term "throwing power" means the ability to plate in low current density areas with the same thickness as in higher current density areas. The term "cycle" means a series of events that are repeated in the same order. The term "immediately" means that there are no intervening steps. All amounts are percent by weight, unless otherwise noted. All numerical ranges are inclusive and combinable in any order except where it is logical that such numerical ranges are constrained to add up to 100%.

The present invention is directed to electroplating through-holes with copper by the application of direct current or DC to a copper electroplating bath which includes a substrate containing a plurality of through-holes. A direct current electroplating cycle of a substrate with a plurality of through-holes of the present invention is initiated by first applying a first predetermined current density to the substrate immersed in a copper electroplating bath for a first predetermined period of time followed by reducing the first predetermined current density to a lower second predetermined current density and applying the lower second predetermined current density to the substrate in the copper electroplating bath for a second predetermined period of time. Optionally the DC cycle can be repeated with the same predetermined high and low current densities with the same predetermined time periods or the subsequent electroplating DC cycle can have a different high current density and first predetermined period of time followed by a different low current density and second predetermined period of time as long as each individual cycle begins with a first current density which is higher than the subsequent second current density. The high current density time period is preferably shorter than the low current density time period. Preferably, the initial current density is immediately followed by a lower current density. The method reduces or eliminates void formation in the through-holes, reduces dimple sizes and inhibits or eliminates nodule formation.

Figure 2:
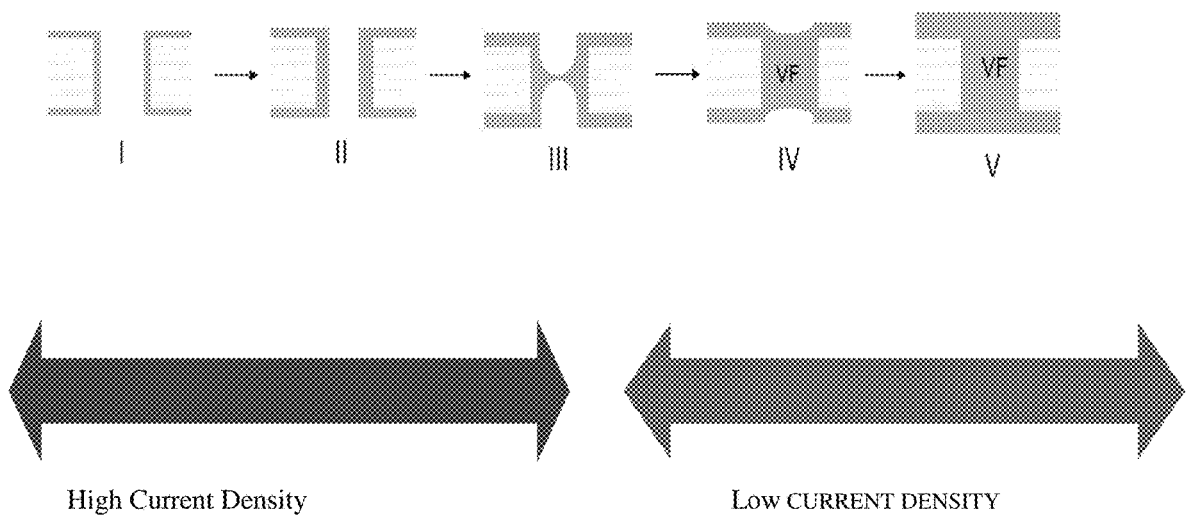
FIG. 2 is a schematic of through-hole filling by applying direct current to the substrate where the initial current density is higher than the subsequent current density.

FIG. 2 is a schematic of the through-hole filling method of the present invention. A through-hole I is illustrated at the initial stage of the electroplating method where high current density is initially applied. After a period of time the walls of the through-hole is conformal plated II. By the end of the high current density time period, the through-hole is filled at or near its center III forming a via-like configuration. Application of the lower direct current density begins filling the via-like configuration IV until the entire through-hole is filled V and free of voids. The through-hole is also free of dimples and nodules.

In general, current densities can range from 0.5 ASD to as high as 5 ASD with the proviso that the first current density of the plating cycle is always higher than the second current density of the cycle. Preferably initial or first current densities are from 1 ASD to 5 ASD and second or low current densities are from 0.5 ASD to 3 ASD. More preferably high current densities are from 1.5 ASD to 4 ASD and low current densities are from 0.5 ASD to 2 ASD.

Plating times can vary. Preferably the high current density has a shorter time than the low current density. Preferably the high current density plating time is from 5 minutes to 30 minutes, more preferably from 10 minutes to 25 minutes. Preferably the low current density time period can range from 60 minutes to 200 minutes, more preferably from 90 minutes to 180 minutes.

Preferably the copper electroplating bath is agitated during the electroplating method of filling the through-holes to encourage copper bath additives to be uniformly deposited over the surface of the substrate and in the through-holes. Any conventional plating bath agitation apparatus can be used. When the high current density is being applied, the rate of agitation is lower than during application of the low current density. In general, bath agitation is 4 L/minute to 8 L/minute during high current density and 8 L/minute to 24 L/minute during low current density. Plating temperatures range from room temperature to 60° C.

Prior to filling through-holes, substrates are preferably plated with a layer of electroless copper such that the electroless copper is adjacent a surface of the substrate and the walls of the through-holes. Conventional electroless copper plating baths as well as conventional electroless plating methods may be used to deposit the copper layer. Such electroless copper baths and methods are well known in the art and literature. An example of a commercially available electroless copper bath is CIRCUPOSIT™ 880 Electroless Process plating formulation and method (available from Dow Electronic Materials, Marlborough, Mass.). The electroless copper may have a thickness, typically, from 0.25 μm to 6 μm, more typically from 0.25 μm to 3 μm. Optionally, the electroless copper is plated with a layer of electrolytic flash copper to protect it from corrosion. The thickness of the electroplated flash copper adjacent the electroless copper layer ranges from 0.5 μm to 15 μm, typically from 1 μm to 10 μm, more typically from 1 μm to 5 µm. Conventional electrolytic copper baths may be used to plate the flash layer. Such copper baths are well known in the art and literature.

The through-holes of the substrate typically range in diameter from 75 µm to 125 µm. The through-holes traverse the width of the substrates and are typically 100 µm to 400 µm in depth. Substrate thicknesses may range from 100 µm or greater, typically 200 µm to 300 µm.

Substrates include printed circuit boards which may contain thermosetting resins, thermoplastic resins and combinations thereof, including fiber, such as fiberglass, and impregnated embodiments of the foregoing.

Thermoplastic resins include, but are not limited to acetal resins, acrylics, such as methyl acrylate, cellulosic resins, such as ethyl acetate, cellulose propionate, cellulose acetate butyrate and cellulose nitrate, polyethers, nylon, polyethylene, polystyrene, styrene blends, such as acrylonitrile styrene and copolymers and acrylonitrile-butadiene styrene copolymers, polycarbonates, polychlorotrifluoroethylene, and vinylpolymers and copolymers, such as vinyl acetate, vinyl alcohol, vinyl butyral, vinyl chloride, vinyl chloride-acetate copolymer, vinylidene chloride and vinyl formal.

Thermosetting resins include, but are not limited to allyl phthalate, furane, melamine-formaldehyde, phenol-formaldehyde and phenol-furfural copolymers, alone or compounded with butadiene acrylonitrile copolymers or acrylonitrile-butadiene-styrene copolymers, polyacrylic esters, silicones, urea formaldehydes, epoxy resins, allyl resins, glyceryl phthalates and polyesters.

The printed wiring boards may include low or high $T_g$ resins. Low $T_g$ resins have a $T_g$ below 160° C. and high $T_g$ resins have a $T_g$ of 160° C. and above. Typically high $T_g$ resins have a $T_g$ of 160° C. to 280° C. or such as from 170° C. to 240° C. High $T_g$ polymer resins include, but are not limited to, polytetrafluoroethylene (PTFE) and polytetrafluoroethylene blends. Such blends include, for example, PTFE with polypheneylene oxides and cyanate esters. Other classes of polymer resins which include resins with a high $T_g$ include, but are not limited to, epoxy resins, such as difunctional and multifunctional epoxy resins, bimaleimide/triazine and epoxy resins (BT epoxy), epoxy/polyphenylene oxide resins, acrylonitrile butadienestyrene, polycarbonates (PC), polyphenylene oxides (PPO), polypheneylene ethers (PPE), polyphenylene sulfides (PPS), polysulfones (PS), polyamides, polyesters such as polyethyleneterephthalate (PET) and polybutyleneterephthalate (PBT), polyetherketones (PEEK), liquid crystal polymers, polyurethanes, polyetherimides, epoxies and composites thereof.

Conventional acid copper electroplating baths for plugging and filling through-holes may be used. Only one bath formulation directed to filling through-holes is used and the conventional process where the initial bath formulation is changed to a via filling bath formulation to complete through-hole filling is avoided. In addition to sources of copper ions, preferably, the copper electroplating baths include one or more brighteners, levelers and suppressors. Conventional brighteners, levelers and suppressors may be used.

Sources of copper ions include, but are not limited to water soluble halides, nitrates, acetates, sulfates and other organic and inorganic salts of copper. Mixtures of one or more of such copper salts may be used to provide copper ions. Examples include copper sulfate, such as copper sulfate pentahydrate, copper chloride, copper nitrate, copper hydroxide and copper sulfamate. Conventional amounts of copper salts may be used in the compositions. Copper salts are included in the bath in amounts of 50 g/l to 350 g/L, typically 100 g/L to 250 g/L.

Acids include, but are not limited to sulfuric acid, hydrochloric acid, hydrofluoric acid, phosphoric acid, nitric acid, sulfamic acid and alkylsulfonic acids. Such acids are included in conventional amounts. Typically such acids are included in the acid copper baths in amounts of 25 g/l to 350 g/L.

Brighteners include, but are not limited to 3-mercaptopropylsulfonic acid and its sodium salt, 2-mercapto-ethanesulfonic acid and its sodium salt, and bissulfopropyl disulfide and its sodium salt, 3-(benzthiazoyl-2-thio)-propylsulfonic acid sodium salt, 3-mercaptopropane-1-sulfonic acid sodium salt, ethylenedithiodipropylsulfonic acid sodium salt, bis-(p-sulfophenyl)-disulfide disodium salt, bis-(ω-sulfobutyl)-disulfide disodium salt, bis-(ω-sulfohydroxypropyl)-disulfide disodium salt, bis-(ω-sulfopropyl)-disulfide disodium salt, bis-(ω)-sulfopropyl)-sulfide disodium salt, methyl-(ω)-sulfopropyl)-disulfide sodium salt, methyl-(ω)-sulfopropyl)-trisulfide disodium salt, O-ethyl-dithiocarbonic acid-S-(ω)-sulfopropyl)-ester, potassium salt thioglycolic acid, thiophosphoric acid-O-ethyl-bis-(ω-sulfpropyl)-ester disodium salt, thiophosphoric, acid-tris (ω-sulfopropyl)-ester trisodium salt, N,N-dimethyldithiocarbamic acid (3-sulfopropyl) ester, sodium salt, (O-ethyldithiocarbonato)-S-(3-sulfopropyl)-ester, potassium salt, 3-[(amino-iminomethyl)-thio]-1-propanesulfonic acid and 3-(2-benzthiazolylthio)-1-propanesulfonic acid, sodium salt. Preferably the brightener is bissulfopropyl disulfide or its sodium salt. Typically the brighteners are included in amounts of 1 ppb to 500 ppm, preferably from 50 ppb to 10 ppm.

Levelers included in the acid copper electroplating baths for filling through-holes are preferably reaction products of heterocyclic aromatic compounds with epoxy compounds. Synthesis of such compounds is disclosed in the literature such as in U.S. Pat. No. 8,268,158. More preferably the levelers are reaction products of at least one imidazole compound of the formula:

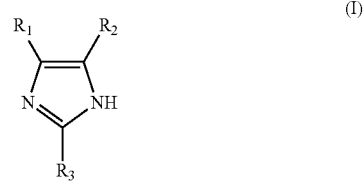

wherein $R_1$, $R_2$ and $R_3$ are independently chosen from H, $(C_1-C_{12})$alkyl, $(C_2-C_{12})$alkenyl, and aryl and provided that $R_1$ and $R_2$ are not both H. That is, the reaction products contain at least one imidazole wherein at least one of $R_1$ and $R_2$ is $(C_1-C_{12})$alkyl, $(C_2-C_{12})$alkenyl, or aryl. Such imidazole compound is substituted with a $(C_1-C_{12})$alkyl, $(C_2-C_{12})$alkenyl, or aryl at the 4- and/or 5-position. Preferably, $R_1$, $R_2$ and $R_3$ are independently chosen from H, $(C_1-C_8)$alkyl, $(C_2-C_7)$alkenyl and aryl, more preferably H, $(C_1-C_6)$alkyl, $(C_3-C_7)$alkenyl and aryl, and even more preferably H, $(C_1-C_4)$alkyl, $(C_3-C_6)$alkenyl and aryl. The $(C_1-C_{12})$alkyl groups and the $(C_2-C_{12})$alkenyl groups may each optionally be substituted with one or more of hydroxyl groups, halogen, and aryl groups. Preferably, the substituted $(C_1-C_{12})$alkyl group is an aryl-substituted $(C_1-C_{12})$alkyl group, and more preferably is $(C_1-C_4)$alkyl. Exemplary are $(C_1-C_4)$alkyl groups include, without limitation, benzyl, phenethyl, and methylnaphthyl. Alternatively, each of the $(C_1-C_{12})$alkyl groups and the $(C_2-C_{12})$alkenyl groups may contain a cyclic alkyl or cyclic alkenyl group, respectively, fused with an aryl group. As used herein, the term "aryl" refers to any organic radical derived from an aromatic or heteroaromatic moiety by the removal of a hydrogen atom. Preferably, the aryl group contains 6-12 carbon atoms. The aryl group in the present invention may optionally be substituted with one or more of $(C_1-C_4)$alkyl and hydroxyl. Exemplary aryl groups include, without limitation, phenyl, tolyl, xylyl, hydroxytolyl, phenolyl, naphthyl, furanyl, and thiophenyl. The aryl group is preferably phenyl, xylyl or naphthyl. Exemplary $(C_1-C_{12})$alkyl groups and substituted $(C_1-C_{12})$alkyl groups include, without limitation, methyl, ethyl, n-propyl, iso-propyl, n-butyl, iso-butyl, sec-butyl, n-pentyl, 2-pentyl, 3-pentyl, 2-(2-methyl)butyl, 2-(2,3-dimethyl)butyl, 2-(2-methyl)pentyl, neopentyl, hydroxymethyl, hydroxyethyl, hydroxypropyl, cyclopentyl, hydroxcyclopentyl, cyclopentylmethyl, cyclopentylethyl, cyclohexyl, cyclohexylmethyl, hydroxycyclohexyl, benzyl, phenethyl, naphthylmethyl, tetrahydronaphthalenyl and tetrahydronaphthylmethyl. Exemplary $(C_2-C_8)$alkenyl groups include, but are not limited to allyl, styrenyl, cyclopentenyl, cyclopentylmethyl, cyclopentenylethyl, cyclohexenyl, cyclohexenylmethyl and indenyl. Preferably, the at least one imidazole compound is substituted with a $(C_1-C_8)$alkyl, $(C_3-C_7)$alkenyl, or aryl at the 4- or 5-position. More preferably, the at least one imidazole is substituted with $(C_1-C_6)$alkyl, $(C_3-C_7)$alkenyl, or aryl at the 4- or 5-position. Still more preferably, at least one imidazole is substituted at the 4- or 5-position with methyl, ethyl, propyl, butyl, allyl or aryl. The imidazole compounds are generally commercially available from a variety of sources, such as Sigma-Aldrich (St. Louis, Mo.) or may be prepared from literature methods.

One or more of the above described imidazole compounds are reacted with one or more epoxy compounds having formula:

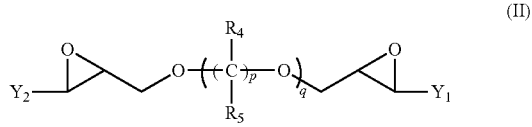

where $Y_1$ and $Y_2$ are independently chosen from hydrogen and $(C_1-C_4)$alkyl, $R_4$ and $R_5$ are independently chosen from hydrogen, $CH_3$ and OH, p=1-6 and q=1-20. Preferably, $Y_1$ and $Y_2$ are both H. When p=2, it is preferred that each $R_4$ is H, $R_5$ is chosen from H and $CH_3$, and q=1-10. When p=3, it is preferred that at least one $R_5$ is chosen from $CH_3$ and OH, and q=1. When p=4, it is preferred that both $R_4$ and $R_5$ are H, and q=1. Exemplary compounds of formula (II) include, but are not limited to: 1,4-butanediol diglycidyl ether, ethylene glycol diglycidyl ether, di(ethylene glycol) diglycidyl ether, poly(ethylene glycol) diglycidyl ether compounds, glycerol diglycidyl ether, neopentyl glycol diglycidyl ether, propylene glycol diglycidyl ether, di(propylene glycol) diglycidyl ether, and poly(propylene glycol) diglycidyl ether compounds. Poly(ethylene glycol) diglycidyl ether compounds of formula II are those compounds where each of $R_4$ and $R_5$=H, p=2, and q=3-20, and preferably q=3-15, more preferably q=3-12, and still more preferably q=3-10. Exemplary poly(ethylene glycol) diglycidyl ether compounds include tri(ethylene glycol) diglycidyl ether, tetra(ethylene glycol) diglycidyl ether, penta(ethylene glycol) diglycidyl ether, hexa(ethylene glycol) diglycidyl ether, nona(ethylene glycol) diglycidyl ether, deca(ethylene glycol) diglycidyl ether, and dodeca(ethylene glycol) diglycidyl ether. Poly (propylene glycol) diglycidyl ether compounds of formula II are those compounds where each of $R_4$=H and one of $R_5$=$CH_3$, p=2, and q=3-20, and preferably q=3-15, more preferably q=3-12, and still more preferably q=3-10. Exemplary poly(propylene glycol) diglycidyl ether compounds include tri(propylene glycol) diglycidyl ether, tetra(propylene glycol) diglycidyl ether, penta(propylene glycol) diglycidyl ether, hexa(propylene glycol) diglycidyl ether, nona (propylene glycol) diglycidyl ether, deca(propylene glycol) diglycidyl ether, and dodeca(propylene glycol) diglycidyl ether. Suitable poly(ethylene glycol) diglycidyl ether compounds and poly(propylene glycol) diglycidyl ether compounds are those having a number average molecular weight of from 350 to 10000, and preferably from 380 to 8000.

Other additives which may be included in the acid copper electroplating baths are one or more complexing agents, one or more sources of chloride ions, stabilizers such as those which adjust mechanical properties, provide rate control, refine grain structure and modify deposit stress, buffering agents, suppressors and carriers. They may be included in the acid copper electroplating bath in conventional amounts.

The methods reduce or inhibit voids and dimple formation during through-hole filling. The % void area of through-holes is reduced or eliminated. The high current density immediately followed by the low current density method can provide through-hole filling with 10% to 15% voids or less, such as 0% to 2%. Dimple formation is 10 μm or less, preferably dimple size is 5 μm or less with no voids in the through-holes. The reduced depth of the dimples and voids improves throwing power, thus provides a substantially uniform copper layer on the surface of the substrate.

The following examples are included to further illustrate the invention but are not intended to limit its scope.

EXAMPLE 1

An FR4/glass-epoxy coupon 5 cm wide, 15 cm long and 200 μm thick with a plurality of through-holes was provided by Tech Circuit. The through-holes had an average diameter of 100 μm. The coupon was plated with CIRCUPOSIT™ 880 Electroless Process plating formulation and method (available from Dow Electronic Materials, Marlborough, Mass.) to form a copper layer on one side of the coupon and on the walls of the through-holes. The thickness of the copper layer on the coupon was 0.3 μm. The coupon was pre-cleaned using a conventional copper cleaner. The coupon was then placed in a Haring cell which contained a copper electroplating bath with a formula as shown in the Table.

TABLE

| COMPONENT | AMOUNT |
|---|---|
| Copper sulfate pentahydrate | 220 g/L |
| Sulfuric acid | 40 g/L |
| Chloride ion from hydrochloric acid | 50 ppm |
| Polyethylene glycol | 2 g/L |
| 4-phenylimidazole/imidazole/1,4-butanediol diglycidyl ether copolymer | 50 mg/L |
| Bis-sodium sulfopropyl)-disulfide | 10 mg/L |

Figure 3:
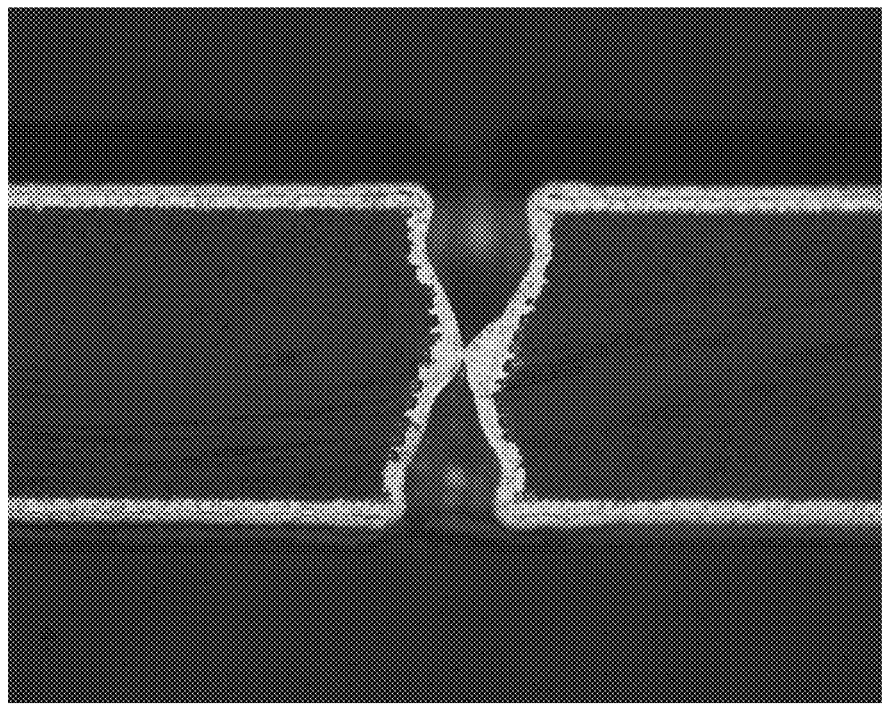
FIG. 3 is a cross-section image of a through-hole with a via-like configuration.
Figure 4:
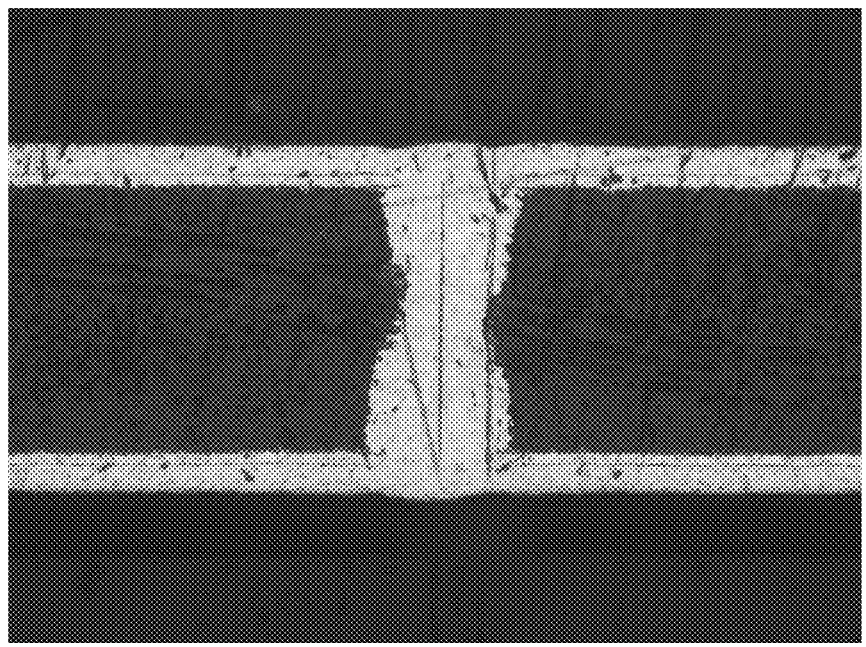
FIG. 4 is a cross-section image of a completely filled through-hole free of voids.
Figure 5:
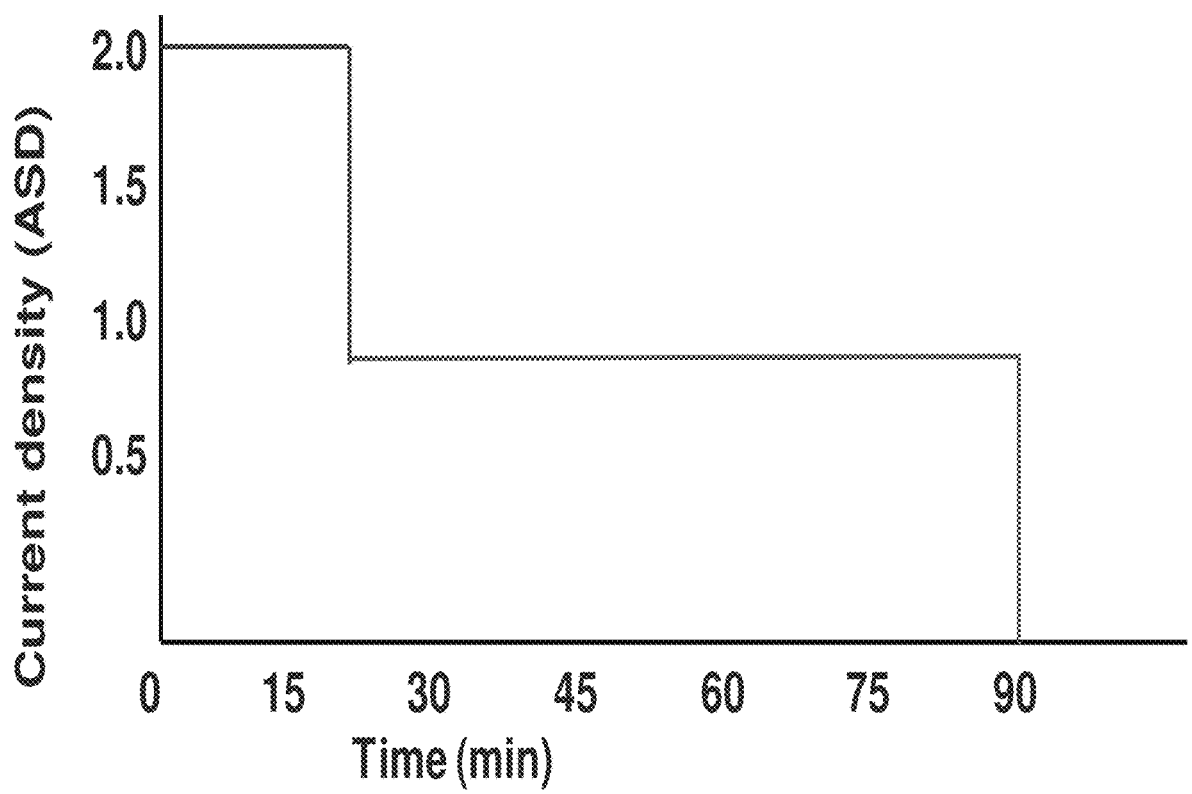
FIG. 5 is a diagram of current density in ASD versus time in minutes of a DC cycle of the present invention used to fill through-holes.

The coupon was connected to a conventional DC rectifier. The counter electrode in the Haring cell was a DT-4 iridium coated titanium insoluble anode. The plating bath was air agitated during electroplating at 4 L/minute. The DC current density was set at 2 ASD. Copper electroplating was done for 20 minutes at room temperature to form a via-like configuration substantially the same as shown in FIG. 3. The sectioned samples were examined for dimples and voids using a conventional optical microscope in combination with Leica Application Suit V3 (available from Leica Microsystems). FIG. 3 is a cross section image of an FR4/glass-epoxy coupon 5 cm wide, 15 cm long and 200 μm thick plated at the high current density of 2 ASD for 20 minutes at room temperature and using the copper electroplating bath of the Table above. After 20 minutes the current density was reduced to 1 ASD with bath agitation of 8 L/minute and copper electroplating was continued for a total of 90 minutes to completely fill the through-holes as shown in FIG. 4. After plating, the coupon was rinsed with DI water and cross sectioned and examined for through-hole filling with a conventional optical microscope in combination with Leica Application Suit V3. FIG. 4 is a cross section image of one of the through-holes. All of the through-holes which were examined appeared void-free. In addition, all of the dimples examined were less than 5 μm. No nodules were observed. FIG. 5 is a diagram of the DC cycle of current density in ASD versus time in minutes used to fill the through-holes.

EXAMPLE 2 (COMPARATIVE)

An FR4/glass-epoxy coupon 5 cm wide, 15 cm long and 200 μm thick with a plurality of through-holes were provided by Tech Circuit. The through-holes had an average diameter of 100 μm. The coupons were plated with CIRCUPOSIT™ 880 Electroless Process plating formulation and method (available from Dow Electronic Materials, Marlborough, Mass.) to form a copper layer on one side of the coupon and on the walls of the through-holes. The thickness of the copper layer on each coupon was 0.3 μm. The coupon was pre-cleaned using a conventional copper cleaner. The coupon was then placed in a Haring cell which contained a copper electroplating bath with a formula as shown in the Table in Example 1.

The coupon was connected to a conventional DC rectifier. The counter electrodes in the Haring cell were insoluble anodes. The plating baths were air agitated during electroplating at 4 L/minute. Plating was done for 63 minutes at room temperature. The current density was set at 1.5 ASD and was not changed. The DC diagram was substantially the same as shown in FIG. 1 except for the plating time.

Figure 6:
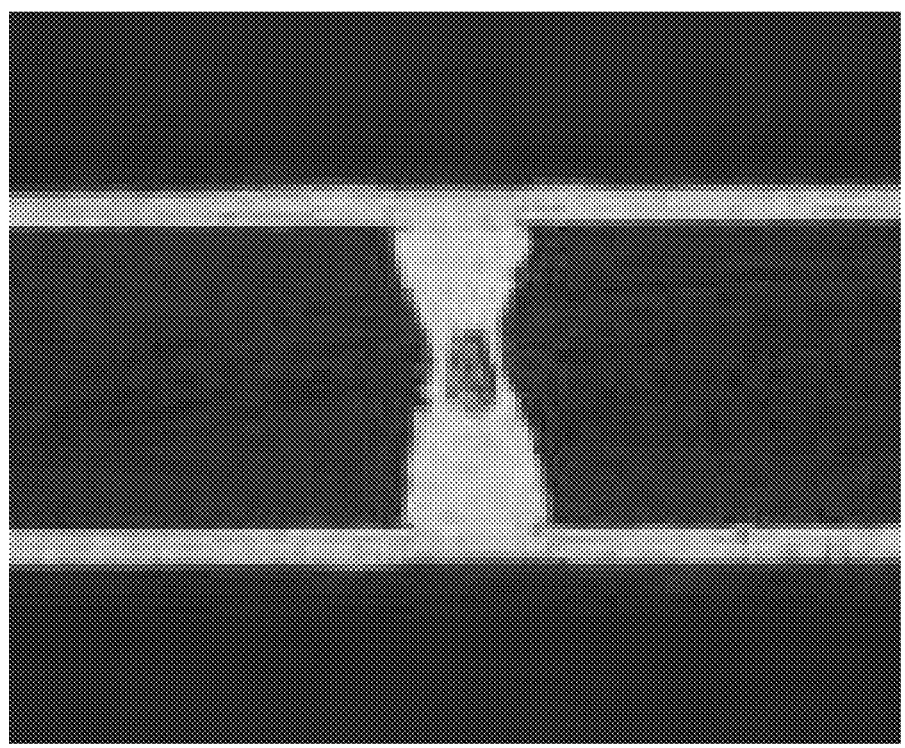
FIG. 6 is a cross section image of a through-hole with a void in the center.
Figure 7:
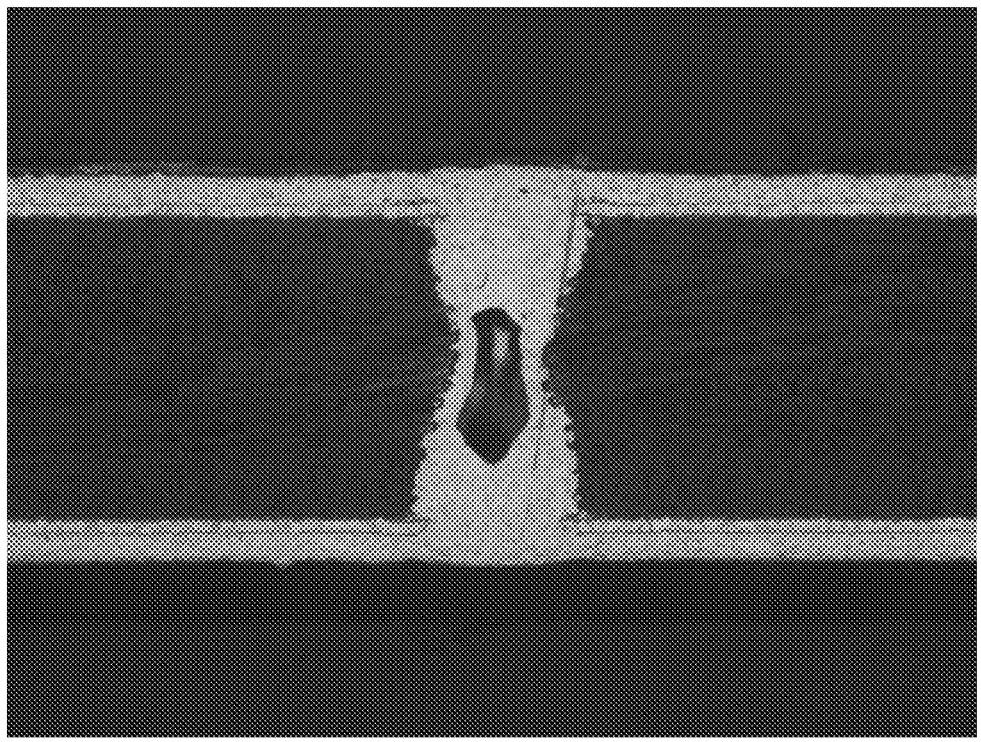
FIG. 7 is a cross section image of a through-hole with a void in the center.

After electroplating the coupon was removed from the Haring cell, rinsed with DI water and sectioned for an analysis of through-hole filling. The sectioned samples were examined for voids, dimples and nodules using a conventional optical microscope in combination with Leica Application Suit V3. Although no nodules were observed and dimples appeared to be 5 μm or less, substantially all of the through-holes observed had major voiding as shown in FIGS. 6 and 7.

What is claimed is:
1. A method comprising:
 a) providing a printed circuit board with a plurality of through-holes comprising a layer of electroless copper, copper flash or combinations thereof on a surface of the printed circuit board and walls of the plurality of through-holes, wherein the through-holes have diameters of 75-125 μm and the printed circuit board is 100 μm thick or greater;
 b) immersing the printed circuit board in a copper electroplating bath comprising an anode; and
 c) filling the through-holes with copper by a direct current cycle consisting of applying a current density for a first predetermined period of time followed by applying a lower current density for a second predetermined period of time, wherein the current density for the first predetermined period of time is of a shorter time period than the predetermined time period of the lower current density without repeating the direct current cycle.
2. The method of claim 1, wherein the current density ranges from 1 ASD to 5 ASD.
3. The method of claim 2, wherein the current density ranges from 1.5 ASD to 4 ASD.
4. The method of claim 1, wherein the lower current density ranges from 0.5 ASD to 3 ASD.
5. The method of claim 4, wherein the lower current density ranges from 0.5 ASD to 2 ASD.
6. The method of claim 1, wherein the first predetermined period of time is from 5 minutes to 30 minutes.
7. The method of claim 1, wherein the second predetermined time period is from 60 minutes to 200 minutes.
8. The method of claim 1, wherein the printed circuit board is 200 μm to 300 μm thick.

* * * * *